(12) United States Patent
Rudmann et al.

(10) Patent No.: US 9,485,397 B2
(45) Date of Patent: Nov. 1, 2016

(54) CAMERA, AND METHOD OF MANUFACTURING A PLURALITY OF CAMERAS

(75) Inventors: Hartmut Rudmann, Jona (CH); Stephan Heimgartner, Passugg (CH)

(73) Assignee: Heptagon Micro Optics Pte. Ltd., Singapore (SG)

( * ) Notice: Subject to any disclaimer, the term of this patent is extended or adjusted under 35 U.S.C. 154(b) by 669 days.

(21) Appl. No.: 13/702,671

(22) PCT Filed: Jun. 10, 2011

(86) PCT No.: PCT/CH2011/000142
§ 371 (c)(1),
(2), (4) Date: Sep. 17, 2013

(87) PCT Pub. No.: WO2011/156928
PCT Pub. Date: Dec. 22, 2011

(65) Prior Publication Data
US 2014/0002726 A1 Jan. 2, 2014

Related U.S. Application Data

(60) Provisional application No. 61/354,392, filed on Jun. 14, 2010.

(51) Int. Cl.
*H04N 5/225* (2006.01)
*H01L 27/146* (2006.01)

(52) U.S. Cl.
CPC ...... *H04N 5/2254* (2013.01); *H01L 27/14618* (2013.01); *H01L 27/14623* (2013.01); *H01L27/14625* (2013.01); *H01L 27/14632* (2013.01); *H01L 27/14683* (2013.01); *H01L 27/14687* (2013.01); *H04N 5/2257* (2013.01); *H01L 2924/0002* (2013.01); *Y10T 29/49002* (2015.01)

(58) Field of Classification Search
USPC ........................................ 348/340
See application file for complete search history.

(56) References Cited

U.S. PATENT DOCUMENTS

| 4,323,925 | A | 4/1982 | Abell et al. |
| 4,561,015 | A | 12/1985 | Korch |
| 2004/0217454 | A1 | 11/2004 | Brechignac et al. |
| 2009/0122175 | A1 | 5/2009 | Yamagata |

FOREIGN PATENT DOCUMENTS

| EP | 0 840 502 | 5/1998 |
| EP | 1 357 514 | 10/2003 |
| EP | 1 677 518 | 7/2006 |
| FR | 2 824 953 | 11/2002 |
| JP | 2006-310379 | 11/2006 |
| WO | 2009/076789 | 6/2009 |
| WO | 2009/151903 | 12/2009 |

OTHER PUBLICATIONS

European Patent Office, Int'l Preliminary Report on Patentability for international application No. PCT/CH2011/000142 (13 pages), issued on Dec. 14, 2012.

*Primary Examiner* — Roberto Velez
*Assistant Examiner* — Stephen Coleman
(74) *Attorney, Agent, or Firm* — Fish & Richardson P.C.

(57) ABSTRACT

In accordance with the invention, a camera or optical module for a camera is provided, the camera or optical module comprising: —a first substrate with a plurality of first optical devices, —a second substrate with a plurality of second optical devices, —and a spacer between the first substrate and the second substrate, the spacer having a first and a second attachment surface, the first substrate attached to the first attachment surface and the second spacer attached to the second attachment surface, —the spacer having a through hole from the first attachment surface to the second attachment surface so that there is an interior space between the first substrate and the second substrate, the interior space being hermetically closed off, —the first optical devices and the second optical devices being mutually arranged so that light impinging, from an object side, on a first optical device is directed to an assigned second optical device through the interior space, —the camera further comprising a screen device in the interior space, the screen device comprising one screening wall or at a plurality of screening walls, the screening wall(s) blocking off light portions from a first device from getting to a second device other than the assigned second device.

24 Claims, 4 Drawing Sheets

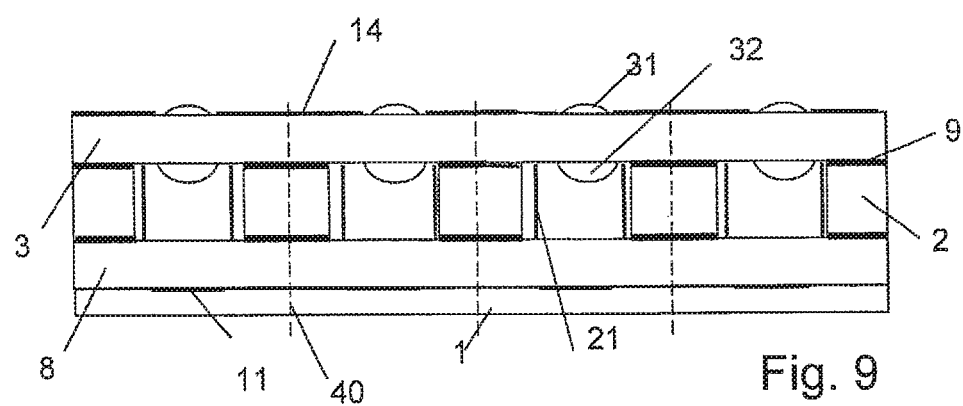
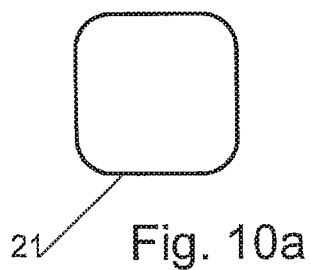 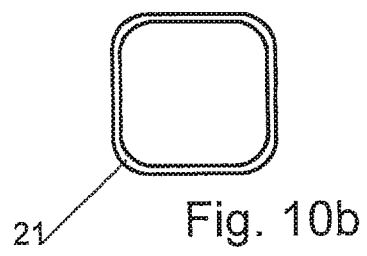

CAMERA, AND METHOD OF MANUFACTURING A PLURALITY OF CAMERAS

FIELD OF THE INVENTION

The invention is in the field of camera devices such as CMOS or CCD cameras. It pertains to a camera or optical module for a camera, and to a method of manufacturing a plurality of cameras.

BACKGROUND OF THE INVENTION

Optical devices, such as cameras or integrated camera optics, are nowadays integrated in a large percentage of any electronic devices manufactured, including mobile phones, computers, etc. It is increasingly important that such cameras can be manufactured economically, for example in a parallel process, and that they have as few parts as possible that are mechanically complicated, difficult to manufacture or delicate to handle. Especially for mobile phone applications but also for other applications, there is moreover an increasing demand for cameras that are thin, i.e. the extension in direction of the optical axis (z extension) is small. Nevertheless, there is also an increasing demand on the resolution that should be achieved by such integrated cameras.

Digital signal processing has made cameras with no movable parts increasingly effective. Functions such as focusing that previously had to be carried out mechanically can be carried out by according software in accordance with a concept that has become known under the name "computational photography". One concept that has become known is the so-called 'plenoptic camera' that uses data on the direction from which radiation impinges to calculate 3D information of an image taken. There is also software available that can calculate a high resolution image from a plurality of low resolution images taken from a same viewpoint at the same time. An example of an according teaching can be found in EP 1 357 514 and the references cited therein. A further example of an according teaching that relates to a camera array is disclosed in WO 2009/151903.

One problem that arises often in compact cameras is the handling of stray light. The thinner and smaller the camera is, the more difficult this may become, among other things because for thin cameras there may be stray light paths to the actual sensor also for light impinging from flat angles

SUMMARY OF THE INVENTION

It is an object of the present invention to provide a camera that is compact, especially that is thin, and that is economical to manufacture. It is an other object of the present invention to provide an economical method for manufacturing a camera or a plurality of cameras. It is yet an other object to provide a relatively thin camera that has improved robustness against stray light impact. It is a further object of the invention to provide an optical module for such a camera.

In accordance with an aspect of the present invention, a camera or optical module for a camera is provided, the camera or optical module comprising:

- a first substrate with a first optical device or plurality of optical devices,
- a second substrate with a second optical device or plurality of optical devices,
- and a spacer between the first substrate and the second substrate, the spacer having a first and a second attachment surface, the first substrate attached to the first attachment surface and the second spacer attached to the second attachment surface,
- the spacer having a through hole from the first attachment surface to the second attachment surface so that there is an interior space between the first substrate and the second substrate, the interior space being, for example hermetically, closed off,
- the first optical device(s) and the second optical device(s) being mutually arranged so that light impinging, from an object side, on the first optical device(s) is directed to the second optical device(s),
- the camera further comprising a screen device in the interior space, the screen device blocking off stray light portions.

The screen device may for example comprise a screening wall or a plurality of screening walls that cover lateral walls of the interior space (the walls being formed by the spacer) and/or—if a plurality of first and second optical devices is present—that extend through the interior space to separate first-optical-device—second-optical-device pairs from each other. The walls may be thin of an essentially homogeneous thickness and/or they may be formed by a body that has at least one vertically extending through hole.

The first and second substrate and the attachment surfaces of the spacer define a plane that in this text is often termed "horizontal". This is not to be understood to mean that the camera has to be held in a certain orientation during use. Rather, the term merely refers to directions orthogonal from an object-to-image direction (or optical axis). At the location of the image sensor(s), the horizontal plane—or x-y-plane—corresponds to the image plane. Directions parallel to the object-to-image direction are referred to as "vertical" or "z direction".

Thus, in accordance with this first aspect of the invention, a screen function is assigned to a screen device that is put in the interior space before or while the same is closed off and that may or may not be fixed to the first substrate and/or the second substrate and/or the spacer. The use of a screen device that is a physical object and that is different from just a coating layer on the first and/or second substrate or on the spacer has substantial advantages.

Firstly, the screen device may have a vertical extension and thus block off stray light portions that cannot be blocked off by a purely horizontal coating of the first and/or second substrate.

Secondly, by being a physical body the screen device may have portions that run through an inner portion of the interior space and that thus may block off light portions from getting from one sub-volume of the interior space to an other sub-volume of the interior space. This may be especially advantageous in situations where the camera is a multi-aperture camera or the optical module is an optical module for a multi-aperture camera, respectively, and where an image sensor of the camera (that may be the second optical device(s) or may be provided in addition to the first and second optical devices) comprises an array of pixel arrays, each pixel array constituting a sub-image-sensor of a sub-camera.

A third advantage of embodiments of the camera or optical module is that a screen device to be placed in the interior volume may be relatively easy and inexpensive to manufacture. Especially, in contrast to the first and second optical devices and their mutual alignment as well as the thickness of the spacer, which all often have to be made highly precise, the tolerances may be much less tight for the screen device. For example, the vertical extension may be smaller than the vertical extension of the spacer by between 0 μm and 50 μm or more, the exact vertical extension not being a critical quantity. Also for other dimensions the manufacturing tolerances are less tight than for other optically active elements. Thus, embodiments of the concept of the first aspect of the invention make possible that a screening function is assumed by a device that is, during stages of the manufacturing process, separate from the expensive-to-manufacture devices that have tight manufacturing tolerances. For example, the screen device may be or may comprise an injection-molded element. While the precision of injection molding is often not sufficient for the optical devices such as lenses, injection molding for high numbers of manufactured parts is very economical.

In an example, the screen device is injection molded using an injection molding tool surface and/or a material that causes some optically visible roughness of at least parts of the surface of the device. Moreover, a dark colored material (for example a black material) may be used. An example of a group of materials suitable for injection molding the screen device are liquid crystal polymers.

In accordance with an other aspect of the invention, a multi-aperture camera or optical module for a multi-aperture camera is provided, the camera or optical module comprising:
- a first substrate with a plurality of first optical devices, for example arranged in an array,
- a second substrate with a plurality of second optical devices, for example arranged in an array,
- and a spacer between the first substrate and the second substrate, the spacer having a first and a second attachment surface, the first substrate attached to the first attachment surface and the second spacer attached to the second attachment surface,
- the spacer having a through hole from the first attachment surface to the second attachment surface so that there is an interior space between the first substrate and the second substrate, the interior space being, for example hermetically, closed off,
- the first optical devices and the second optical devices being mutually arranged so that light impinging, from an object side, on a first optical device is directed to an assigned second optical device through the interior space,
- the camera further comprising a screen in the interior space, the screen blocking off light portions from a first device from getting to a second device other than the assigned second device.

In embodiments of the second aspect of the invention, the screen may be formed by a screen device in accordance with the first aspect of the invention.

Alternatively, the screen may for example be formed by vertically protruding features of the first or second substrate or by features of the spacer and arranged to project into the through hole.

Screening wall(s) of the screen (i.e. for example of the screening device) may range from an image-side surface of the first substrate to an object-side surface of the second substrate. In this, they define sub-volumes of the interior space, each sub-volume assigned to a first device and an assigned second device. The wall(s) may be vertical or approximately vertical. They may be fully non-transparent to visible light and thus, within the interior space, have the effect that essentially no light can get from one sub-volume to an other sub-volume. However, it would also be possible to provide the screen device with some residual transparency and/or to shape it so that the wall(s) do not fully range from an image-side surface of the first substrate to an object-side surface but for example comprise pinnacle-like or other structures.

The screen of a multi-aperture camera of the second aspect may for example comprise a screen body with a plurality of vertical through holes and/or with a plurality of screening walls that extend between first-device-second-device pairs.

For both aspects, the following holds:

The first optical device(s) may (a) be passive optical device(s). The optical device or at least one of the optical devices may comprise a camera lens or lens part and/or an aperture, a filter etc; multiple and/or combined functionalities are possible. The second optical device or at least one of the second optical devices may either also be a passive optical device, or it may be an active optoelectronic device, especially an image sensor. An image sensor may comprise a pixel array, i.e. an array of sensing elements.

It is also possible to provide, in a vertical stack, a plurality of screens/screen devices in subsequent interior spaces in the stack. In such a configuration, there are further a third substrate with one or a plurality of third optical devices and a further spacer, and a further interior space is formed between the second substrate, the further spacer and the third substrate, with a further screen/screen device in the further interior stack. In this, the first and second device(s) would in most cases be (a) passive optical device(s), and the third optical device(s) would be (a) passive or active, optoelectronic device(s).

It would also be possible to provide, in such a vertical stack of three substrates, only one of the interior spaces with a screen device.

This teaching can be extended to even more vertically stacked substrates, with at least one of the interior spaces comprising a screen device.

The camera—or, respectively, a camera that comprises the optical module and an image sensor—has a plurality of sub-cameras, each sub-camera comprising one of the first devices and the assigned second device. Each sub-camera is operational to capture a pre-image. The pre-images of the different sub-cameras may comprise essentially same image sections, corresponding to of the final image. In other words, the sub-cameras may be such that each sub-cameral takes a picture essentially of a same scenery. The optics of the sub-cameras may be identical, or they may be different between at least some of the cameras. Alternatively, the sub-cameras may take pre-images of different, but overlapping image sections. The camera further comprises an analyzing unit for computing an image from the pre-images. The analyzing unit may be integrated in a camera electronics, or it may be an external tool, such as a software tool that runs on a computing device that may be connected to the camera electronics via an appropriate interface.

Each sub-camera preferably has its own aperture. The apertures of the different sub-cameras may be essentially in a same (horizontal) plane.

In embodiments where each sub-camera has its own aperture, the screen/screen device has the following advantage: Light entering the camera through the aperture of a certain sub-camera should not get to the image sensor (the pixel array or the like) of a neighboring sub-camera. However, if the camera is optimized in terms of extension, the sub-cameras have to be close to each other, and this kind of cross talk would have to be expected, especially in the free space between different lenses or between the lenses and the image sensors. The screen/screen device has the function of screening the different sub-cameras from each other in the region of this free space or these free spaces.

Preferably, the screen is a screen device being an element separate from the spacer, manufactured separately and preferably inserted in the through hole of the spacer only during assembly. It may be advantageous to provide the screen device as a separate inlay (thus not one-piece with the spacer). The screen device may then be manufactured by a different technology than the spacer and with materials that are well suited for thin-walled, fine structures. Nevertheless, the advantages of wafer scale manufacturing with a spacer wafer that is subsequently diced, as part of a wafer-scale assembly, into individual camera-scale spacers are maintained.

The screen device may be inserted during a wafer-scale manufacturing process. In this, the first and second substrates are sections of a first and second substrate wafer, and the spacer is a section of a wafer scale spacer (or 'spacer wafer'). The first substrate wafer, the second substrate wafer, the spacer wafer and the plurality of screen devices (preferably one screen device per camera) are assembled, possibly with other wafer-scale components. The resulting wafer-scale assembly is then separated into the individual camera scale devices or modules, while the interior spaces are not affected by the dicing and remains (hermetically) sealed. The dicing lines along which separation takes place are thus between the interior spaces of neighbouring cameras or modules, and not through the interior spaces.

The screen devices may for example be placed in the through holes of the spacer wafer after the first one of the first and second substrate wafers is attached or provisionally attached to the spacer wafer and prior to bringing the second one of the first and second substrate wafers in contact with the spacer wafer.

The screen device may sit loosely in the interior space between the substrates and the spacer. For example, the shapes of the screen device and of the interior space may be adapted to each other so that the screen device can move only to a certain minimal extent.

As an alternative, the screen device may be held in place by positioning features of the spacer and/or of at least one of the first and second substrates; also positioning features added to the substrates, for example by replication are possible.

In addition or as yet another alternative, the screen device may be held in place by an adhesive or other material connection. An adhesive may for example be cured simultaneously with an adhesive that holds together the first and/or the second substrate (possibly as part of the substrate wafer) on the one hand and the spacer on the other hand.

The process of manufacturing, on a wafer scale, a plurality of cameras, in embodiments each comprising a plurality of sub-cameras, comprises the steps of providing a first substrate wafer, a second substrate wafer and a spacer wafer with a plurality of through holes, of bringing, in arbitrary sequence the spacer wafer in contact with one of the first and of the second substrate wafer with a first portion of an adhesive in-between and introducing a screen device in at least one of the through holes, of thereafter bringing the second one of first and of the second substrate wafer and the spacer wafer in contact with each other with a second portion of an adhesive in-between, of hardening the second portion of the adhesive, and of dividing the resulting assembly into a plurality of camera-scale devices or modules, each having an interior space formed by one of said through holes.

The first portion of adhesive may be cured simultaneously with the second portion (for example in accordance with the teaching of PCT/CH 2009/000271 incorporated herein by reference) or may be cured prior to bringing the second one of the wafers in contact with the spacer wafer.

The step(s) of curing a portion/portions of the adhesive may comprise UV curing, i.e. curing by illuminating by ultraviolet radiation. Often, the first substrate wafer and/or the second substrate wafer has an Infrared (IR) filter that is needed for the camera. The transparency of IR filters for UV radiation is often limited, so that the curing may only take place from the side of the respective other substrate. However, if the other substrate is an optoelectronic substrate, it will not be transparent. This problem can be solved:

Either by using an adhesive that is cured thermally, and/or that cures, at room temperature, slowly instead of by curing by UV irradiation, or by providing an IR filter that is structured to comprise a plurality of IR filter sections arranged to be aligned with the through holes of the spacer.

If the screen device is also attached by means of an adhesive, the curing of said adhesive may be contemporarily with the first and/or with the second portion of an adhesive, and the same considerations pertaining to curing hold for this adhesive, too.

'Wafer' or 'Wafer scale' in this text generally refers to the size of disk like or plate like substrates of sizes comparable to semiconductor wafers, such as disks or plates having diameters between 5 cm and 40 cm. A wafer or substrate in the meaning used in this text is a disc or a rectangular plate or a plate of any other shape of any dimensionally stable material; if the wafer is an optical wafer the material is often transparent. The diameter of a wafer disk is typically between 5 cm and 40 cm, for example between 10 cm and 31 cm. Often it is cylindrical with a diameter of either 2, 4, 6, 8 or 12 inches, one inch being about 2.54 cm. The wafer thickness of optical wafers is for example between 0.2 mm and 10 mm, typically between 0.4 mm and 6 mm. Although preferably the wafers have the shapes of circular discs, like semiconductor wafers, other shapes such as approximately rectangular shapes, hexagonal shapes etc. are not excluded. The term 'wafer' in this text is generally not to be interpreted restricting in terms of shape.

BRIEF DESCRIPTION OF THE DRAWINGS

Principles of the invention as well as embodiments thereof will be explained in more detail in the following text with reference to the attached drawings. In the drawings, same reference numerals denote same or analogous elements. The drawings are all schematic and not to scale. They show:

FIG. 9 a camera wafer-scale assembly of single-aperture camera modules; and

FIGS. 10a and 10b screen devices for single-aperture cameras.

DESCRIPTION OF THE PREFERRED EMBODIMENTS

Figure 1:
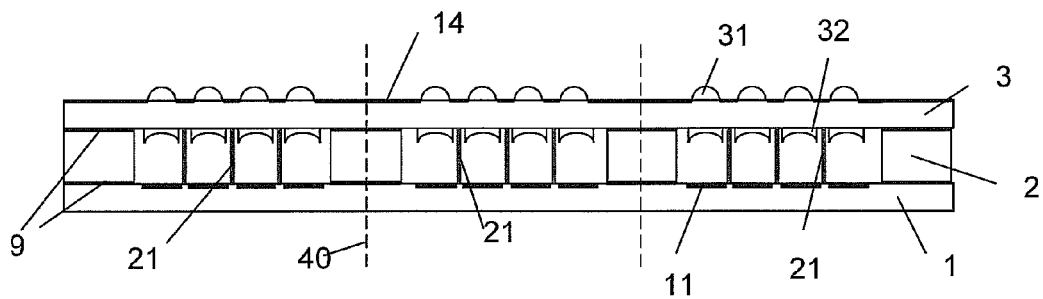
FIG. 1 A wafer-scale assembly of a plurality of multi-aperture camera modules in section.

FIG. 1 schematically depicts a wafer scale assembly of a plurality of cameras. The wafer stack comprises an optoelectronic wafer 1 with a plurality of CMOS or CCD pixel arrays, a spacer wafer 2 and a transparent optical wafer 3 stacked on each other. The optical wafer in this may be considered as a first substrate wafer, and the optoelectronic wafer as a second substrate wafer for the teaching of the present text.

The optoelectronic wafer 1 may be based on a technology known in the art, such as a silicon based CMOS wafer. In contrast to conventional wafers of digital cameras, however, the pixel arrays 11 are depicted to be grouped in groups of four example four, six, nine, twelve, sixteen, twenty, twenty-four or twenty five or any number of pixel arrays arranged for example an array-like manner, each group assigned to one camera. Each array, together with the assigned optics, in itself is functional as a sub-camera and is functional to make a starting image of essentially the whole scenery to be captured.

The spacer wafer may be a transparent or non-transparent plate-like element with a plurality of through holes, each through hole being shaped and arranged to correspond to a camera that comprises a plurality of sub-cameras. Both, the optoelectronic wafer 1 and the optical wafer 3 are attached to the spacer wafer, for example by means of an adhesive, or possibly by means of the spacer wafer being of plastics and being applied in a not completely hardened state, etc.

The spacer wafer is for example of the kind described in WO 2009/076 786, incorporated herein by reference in its entirety. As an alternative, the spacer wafer may also be a spacer wafer of any other material, such as glass, or an other transparent or non-transparent material.

In the wafer-scale assembled state depicted in FIG. 1, when the optoelectronic wafer 1 and the optical wafer 3 are attached to the spacer wafer, the through holes of the spacer wafer form hollow interior spaces between the pixel arrays and the lenses.

The optical wafer 3 may comprise, on one or two sides of a glass substrate, replicated lens elements 31, 32 that form, together with the glass substrate, optical lenses for light impinging from an object side (corresponding to the upper side in the figures) and directed to an image side (corresponding to the lower side in the figures). Each optical lens is assigned to one pixel array and thus belongs to one sub-camera. The sub-cameras may each have an optical axis (not shown in FIG. 1).

In each of the interior spaces between the optoelectronic wafer and the optical wafer, a screen device 21 is arranged. The screen devices are inserted in the through holes of the spacer wafer before the second one of the optical wafer and of the optoelectronic wafer is brought in contact with the spacer wafer. The screen device may for example be inserted in the through hole after the spacer wafer has been brought in contact with the optical wafer (or with the optoelectronic wafer), possibly even after it has been bonded thereto by curing the adhesive, but prior to the spacer wafer being brought in contact with the optoelectronic wafer (or the optical wafer, respectively).

In the herein described embodiments, the screen device is a single screen element comprising a plurality of screening walls arranged in a pattern. It would also be possible to make up the screen device of a plurality of elements, for example of a plurality of wall pieces, that may be assembled prior to the insertion into the through hole of the spacer wafer, or may be assembled while being inserted therein. A single screen element is often advantageous because of the reduced manufacturing and assembling cost.

After assembly of the optical wafer 3 and of the optoelectronic wafer 1 with the spacer wafer 2 and with the screen devices 21, possibly further wafer-scale manufacturing steps may be made. Such further wafer-scale manufacturing steps may comprise the addition of further optical elements. Examples for such further optical elements are an aperture if such aperture is not already present, and/or one or more further optical wafers, if such further optical wafer(s) was/were not already assembled with the depicted optical wafer, with a second spacer wafer between the optical wafers, or with second spacer wafers between the optical wafers, respectively.

After completion of the wafer-scale manufacturing steps, the resulting wafer-scale assembly is divided ("diced") into individual camera-scale components. In the Figures, the locations—"dicing lines" or "dicing straits"—where such separation takes place are marked by dashed lines 40.

Figure 2:
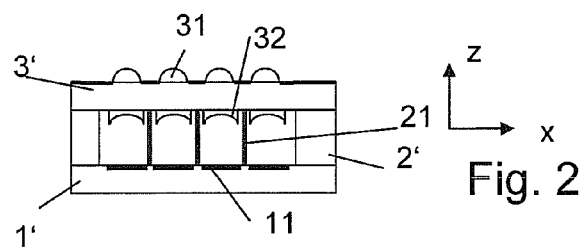
FIG. 2 A camera module.

FIG. 2 depicts a resulting camera module with an optoelectronic device 1'—obtained as a 'dice' of the optoelectronic wafer—, a spacer device 2'—obtained from the spacer wafer—, and on optical device 3'—obtained from the optical wafer.

Figure 3:
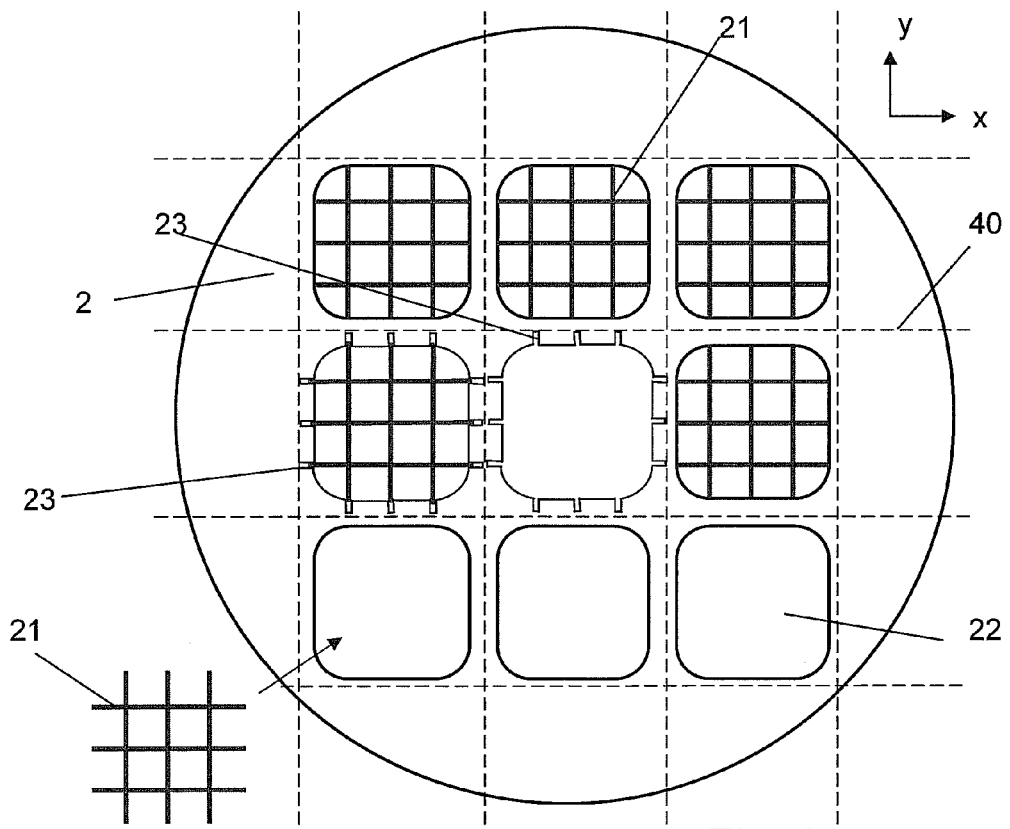
FIG. 3 A top view of a partially assembled wafer-scale assembly of a plurality of camera modules.

In FIG. 3, a spacer wafer 2 and a plurality of screen devices 21 are depicted. The screen devices 21 each comprise a structure of walls that cross at right angles. The spaces between the walls have the x-y dimensions (in-plane dimensions) of the sub-cameras or are slightly larger. The walls of the screen devices 21 may be of any material or material combination that is suitable for forming comparably thin, preferably light absorbing walls, such as of a hard, possibly coated and/or dark colored plastic, a ceramic, a metal, etc. If the screen devices 21 are made of plastic, they can be made by a different technology than the spacer 2'—or also by a same technology. They can for example be made by injection molding, by etching, etc.

While in the depicted embodiments, the dimensions of the sub-cameras of a particular camera are approximately equal, this need not be the case. Rather, a camera may optionally comprise sub-cameras of different sizes. In such a case, the screen device 21 of such a camera will be adapted accordingly.

The screen devices may be held in place in the through holes 22 of the spacer wafer—and ultimately in the interior spaces—for example by one or a combination of the following measures:

The shape and dimension of the screen device 21 may be adapted to the shape and dimension of the through hole 22 so that when the screen device is placed in the through hole 22, there is no degree of freedom for movement in the x-y-plane. In such a case, the manufacturing tolerances of the spacer wafer 2 and of the screen devices will be chosen so that a maximum possible residual movement of the screen devices with respect to the spacer wafer is below a tolerable limit. In FIG. 3, the screen devices of the upper row are positioned by this measure.

The spacer wafer may comprise positioning features 23 that cooperate with the structure of the screen devices to position them in the x-y-plane. Such positioning features may for example comprise axial grooves (i.e. grooves extending in the z direction) in the lateral walls of the through holes. The peripheral walls of the screen devices—which screen devices then are slightly overdimensioned—engage in the grooves. In FIG. 3, the two first holes in the middle row comprise such positioning features.

An adhesive may be used to affix the screen device to the optoelectronic device and/or to the optical device. Such an adhesive may for example be cured simultaneously with curing the adhesive that holds the spacer wafer and the optoelectronic wafer and/or the optical wafer, respectively, together.

The optical wafer and/or the optoelectronic wafer may comprise positioning features. Such positioning features may for example be replicated on the optical wafer simultaneously with replicating the lens elements, and/or the lens elements themselves may form—by their shape and extension—such positioning features. In addition or as an alternative, the optoelectronic wafer and/or the optical wafer may be appropriately grooved or otherwise shaped to comprise a positioning feature.

Figure 4:
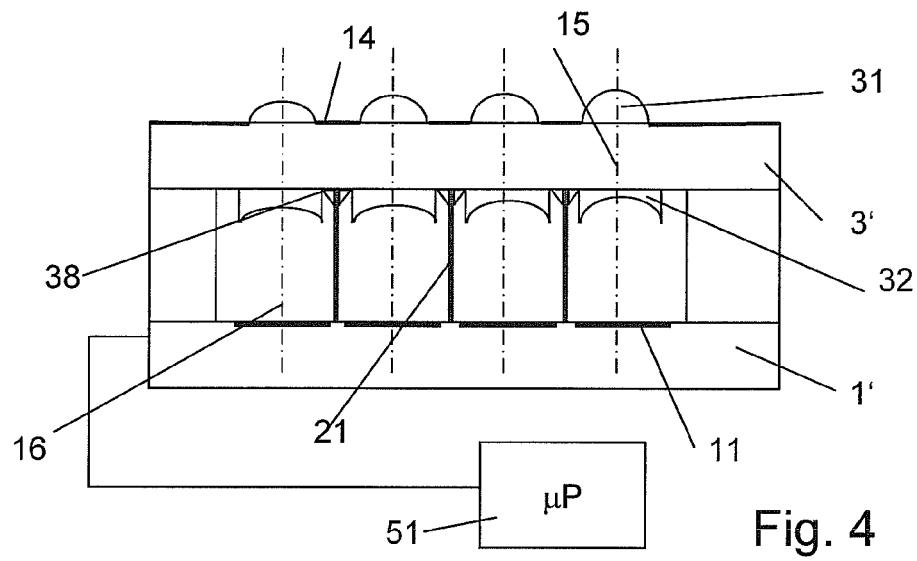
FIG. 4 A camera.
Figure 5:
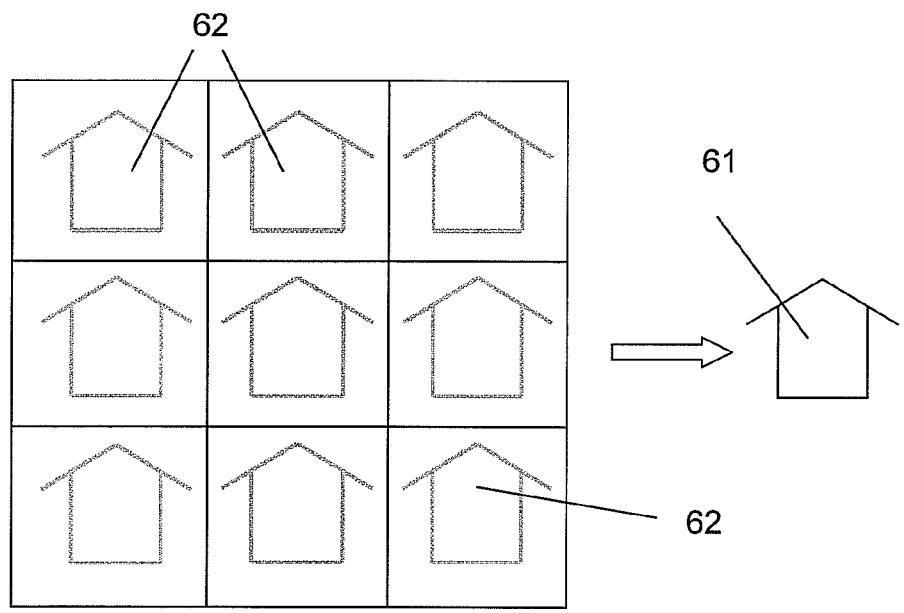
FIG. 5 A schematics of the image processing.

FIG. 4 shows a camera in somewhat more detail. The depicted camera has replicated positioning features 38 of the optical device 3'. However, these are optional. In alternative embodiments of the camera, no such positioning features 38 are present. Instead one or a combination of the other previously described measures for defining the position of the screen device is taken.

Each sub-camera of the camera of FIG. 4 has an aperture. The apertures are formed by a common aperture layer 14—that may for example be of a Chromium based material or material combination—that has one aperture opening for each sub-camera. The aperture together with the lens elements 31, 32 and forms an optical system for imaging an object onto the plane of the pixel arrays 11. (In alternative configurations, the imaging may also be such that for one or more of the sub-cameras, the system does not focus onto the very plane of the pixel array 11 but for example slightly above it. In combination with a microlens array close to the pixel array, functionality of a so-called plenoptic camera may then be obtained.)

In addition to the layer or other shielding object forming the aperture, the camera device may comprise further optical means not depicted in FIG. 4, such as at least one IR filter, a baffle (that for example may be combined with the aperture and be of the kind shown in WO 2009/076 787, or of the kind disclosed in WO 2009/076 788 or of an other type), further lenses, etc.

In the depicted configuration, each sub-camera has an optical axis 16 that is straight and forms a center axis of the respective sub-camera. The lens elements of the different sub-cameras may be identical, or at least some of them may be different. For example, the lens elements of different sub-cameras may be designed to focus on objects of different distances to the camera. Also, the aperture openings need not be identical for the different sub-cameras.

In addition to the optical components (the lenses, aperture, filters etc.) and the pixel arrays, the camera also comprises a camera electronics 51 that communicates with the pixel arrays, as very schematically shown in FIG. 4. The camera electronics is capable of reading out images obtained by the pixel arrays. The camera electronics may further be capable of carrying out digital signal processing. Alternatively, the camera electronics may have an interface that allows a computing device to read out the raw image data, so that digital signal processing can be carried out by the computing device. The software of the camera electronics or of the external computing device is capable of evaluating an image 61 from the pre-images 62 obtained by the sub-cameras. Each pre-image may comprise essentially the image section of the final image 61, however, the quality of the final image is superior to the quality of the sub-images, in terms of resolution, sharpness, depth of sharpness, illumination color and/or an other optical property. The digital signal processing steps that lead from the plurality of pre-images to the final image are not subject to the present invention and are not described in any more detail here.

In the previously described embodiments, the camera was assumed to comprise an image sensor and one lens (comprising two lens elements and a substrate portion between them) per sub-camera only. The lenses of the different sub-cameras in this are at approximately corresponding z positions. However, in practice, often more than one lens—each comprising one or two lens elements—is present, the different lenses being vertically stacked. In such configurations, more than one optical substrates (on a wafer scale: optical wafers) is present, and a further spacer or further spacers may be used as distance holder(s) between the optical substrates. In such a configuration, a screen device of the kind described herein may be located (i) between the optoelectronic device 1', which comprises the image sensors, and the optical device (lens layer) that is the closest to the optoelectronic device, (ii) between two optical devices (lens layers); or (iii) both, between the optoelectronic device and the closest lens layer, and between two of the lens layers.

Figure 6:
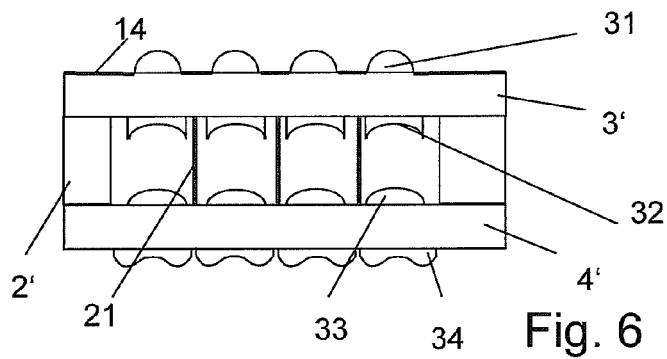
FIG. 6 An optical module for a camera.

FIG. 6 depicts an optical module for a camera with a plurality of sub-cameras. The optical module comprises, in a vertical stack, a first substrate 3' and a second substrate 4'. Each of the first and second substrates has an array of lenses, the lenses defined by lens elements 31, 32, 33, 34 at corresponding locations and the substrate portion between them. In the interior space between the first substrate 3', the spacer 2', and the second substrate 4', a screen device 21 of the kind described hereinbefore is arranged. Also the mechanism for holding the screen device in place may be any one or a combination of the mechanisms discussed referring to the embodiments with the screen device arranged between a (passive) optical substrate and an optoelectronic substrate.

The teaching of FIGS. 1-3 and their description relating to the screen device 21 and the wafer scale assembling applies mutatis mutandis also to the screen device and wafer scale assembling of the optical module of FIG. 6, and further applies to the camera module described hereinafter referring to FIG. 7.

In addition to the depicted elements, the optical module may comprise more or one of the following:

a further spacer attached to the second substrate 4' that can be used for later assembling the optical module with an optoelectronic device to manufacture the camera;

one or more further passive optical substrates, with an array of passive optical elements such as further lenses, and with an additional spacer.

Figure 7:
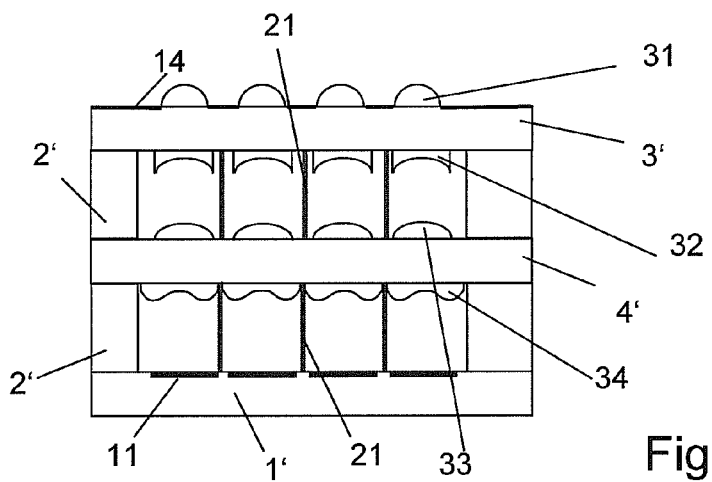
FIG. 7 An other camera module.

FIG. 7 yet shows a camera module with a first optical substrate 3' with lenses, a second optical substrate 4' with lenses and an optoelectronic substrate 1' with image sensors 11. The camera module has two spacers 2', one between the first and the second optical substrates, and the other one between the second optical substrate and the optoelectronic substrate. In the depicted configuration, both interior spaces defined by this configuration each comprise a screen device 21. However, it would also be possible to provide a screen device in the upper (closer to the object side) or in the lower (closer to the image side) interior space only.

A camera based on the camera module of FIG. 7 would in addition to the camera module also comprise a camera electronics.

Various other embodiments may be envisaged without departing from the scope and spirit of the invention. For example, in contrast to the depicted configurations, the sub-cameras need not be arranged in a regular array, all with approximately equal sizes. It would alternatively be possible to have the plurality of sub-cameras arranged in an irregular pattern, and/or one or more of the sub-cameras can have other sizes (for example horizontal extensions) than the other sub-cameras. In this way, for example a larger sub-camera could be the master sub-camera, while the other sub-cameras are smaller and used for obtaining certain corrections, etc.

In the depicted configuration, the image sensors of the different sub-cameras are shown to be separate pixel arrays. However, it would also be possible to have one large pixel array per camera instead of the depicted group of arrays; then the signal processing carried out based on the signals obtained from the pixel arrays will divide the image obtained from the signals into sub-images as starting images; again each starting image essentially of the whole scenery to be captured. In this, the portions of the pixel array assigned to a certain sub-camera function as the different image sensors.

Figure 8A:
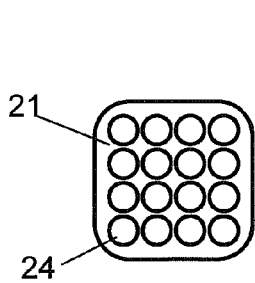
FIGS. 8a-8c alternative screen devices.
Figure 8B:
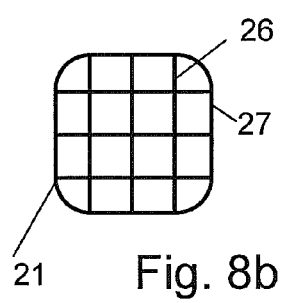
Figure 8C:
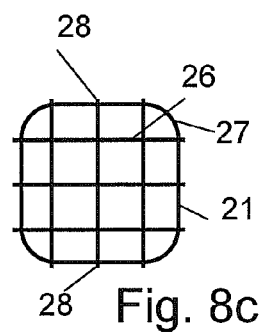

FIGS. 8a, 8b and 8c yet show alternative screen devices 21 that may be used, for example, for camera modules of the above-described architecture.

The screen device 21 of FIG. 8a is formed by an injection molded screen device body that has a plurality of vertical screen device through holes 24, each through hole corresponding to an aperture. The screen device body may for example be of a black material with a certain surface roughness rendering it matt. In contrast to the above-described embodiment of the screen device 21 has a non-constant screening wall thickness because the through holes 24 are approximately cylindrical.

The screen device 21 of FIG. 8b is similar to the of FIG. 3, but in addition to the cross pattern of the screening walls 26 further comprises a circumferential wall 27 forming a shield against light that is transmitted through the spacer itself. The screen devices both of FIG. 3 and of FIG. 8b may also be formed of a plastic material by injection molding, or may be formed for example of brass pieces or of any other light shielding material.

The screen device 21 of FIG. 8c is distinct from the screen device of FIG. 8b in that it further comprises laterally protruding engagement features 28 that may engage with positioning features 23 of the kind depicted in FIG. 3. These engagement features may be unnecessary of the circumferential wall and the through hole 22 geometry are sufficiently precise.

FIG. 9 depicts a wafer-scale assembly of a plurality of single-aperture cameras. The wafer-scale assembly is distinct from the assembly of FIG. 1 by the following features. Each of the features can be realized, departing from any assembly of the hereinbefore described kind, alone or in any combination:

single aperture: each camera comprises a single aperture, wherein the apertures of the different cameras are again formed by a contiguous aperture layer 14. Each camera consequently comprises one image sensor field 11 only. Also, the screen device is of a kind comprising a circumferential wall only and not comprising any 'internal' walls through the interior space separating sub-volumes thereof.

Loose fitting screen device 21: the vertical dimension of the screen device 21 may be somewhat less than the thickness of the spacer together with adhesive layers 9. The exact dimensions of the screen device are not critical quantities for the optical properties of the cameras.

Transparent cover: the optoelectronic wafer 1 is covered by a protecting cover layer 8, for example a glass plate. The optoelectronic wafer 1 together with the cover layer 8 forms the second substrate wafer.

FIGS. 10a and 10b yet depict two variants of a screen device 21 of a single aperture camera. The screen device 21 of FIG. 10a is thin-walled and may for example be made of a piece of brass or a an elastic bendable piece. The screen device 21 of FIG. 10b is depicted to be somewhat thicker, and it may be injection-molded.

What is claimed is:

1. A camera or optical module for a camera, the camera or optical module comprising:
a first substrate with a first optical device or plurality of optical devices,
a second substrate with a second optical device or plurality of optical devices,
and a spacer between the first substrate and the second substrate, the spacer having a first and a second attachment surface, the first substrate attached to the first attachment surface and the second spacer attached to the second attachment surface,
the spacer having a through hole from the first attachment surface to the second attachment surface so that there is an interior space between the first substrate and the second substrate, the interior space being closed off,
the first optical device(s) and the second optical device(s) being mutually arranged so that light impinging, from an object side, on the first optical device(s) is directed to the second optical device(s),
the camera further comprising a screen device in the interior space, wherein a shape of the screen device and a shape of the interior space are adapted to each other such that the screen device can move within the interior space, and the screen device blocking off stray light portions.

2. The camera or optical module according to claim 1, further comprising a third optical device or a plurality of third optical devices, each third optical device comprising an image sensor.

3. The camera or optical module according to claim 1, wherein the interior space is hermetically sealed from an outside.

4. The camera or optical module according to claim 1, wherein the screen device or screen comprises at least one screening wall ranging from an image-side surface of the first substrate to an object-side surface of the second substrate.

5. The camera or optical module according to claim 1, wherein each first optical device comprises a lens.

6. The cameral or optical module according to claim 5, wherein each second optical device comprise a lens or an image sensor.

7. The camera or optical module according to claim 1, wherein the screen device engages positioning features of the spacer and/or of at least one of the first and second substrates.

8. The camera or optical module according to claim 7, wherein the positioning features comprise grooves in a sidewall of the through hole of the spacer.

9. The camera or optical module according to claim 1, wherein the first substrate comprises a plurality of first optical devices, wherein the second substrate comprises a second plurality of second optical devices, wherein the first optical devices and the second optical devices are mutually arranged so that light impinging, from an object side, on a first optical device is directed to an assigned second optical device through the interior space, and wherein the screen device comprise a portion blocking off light portions from a first device from getting to a second device other than the assigned second device.

10. The camera or optical module according to claim 9, wherein said screen device portion is at least one screening wall.

11. The camera or optical module according to claim 9, wherein the second optical devices comprise image sensors, each capable of capturing a sub-image, the camera further comprising a camera electronics, wherein the camera electronics is capable of calculating a single image from the plurality of sub-images or comprises an interface to a computing device capable of calculating a single image from the plurality of sub-images.

12. The camera or optical module according to claim 9, wherein to each first optical device an aperture is assigned, whereby light traversing the aperture from an object side is directed via the first optical device to the assigned second device.

13. The camera or optical module according to claim 9, further comprising a plurality of third optical devices, each third optical device comprising an image sensor, wherein each third optical device is assigned to a first optical device and to a second optical device, each image sensor capable of capturing a sub-image, the camera further comprising a camera electronics, wherein the camera electronics is capable of calculating a single image from the plurality of sub-images or comprises an interface to a computing device capable of calculating a single image from the plurality of sub-images.

14. A multi-aperture camera or optical module for a multi-aperture camera, comprising:
  a first substrate with a plurality of first optical devices,
  a second substrate with a plurality of second optical devices,
  and a spacer between the first substrate and the second substrate, the spacer having a first and a second attachment surface, the first substrate attached to the first attachment surface and the second spacer attached to the second attachment surface,
  the spacer having a through hole from the first attachment surface to the second attachment surface so that there is an interior space between the first substrate and the second substrate,
  the first optical devices and the second optical devices being mutually arranged so that light impinging, from an object side, on a first optical device is directed to an assigned second optical device through the interior space,
  the camera further comprising a screen in the interior space, wherein a shape of the screen and a shape of the interior space are adapted to each other such that the screen can move within the interior space, and the screen blocking off light portions from a first device from getting to a second device other than the assigned second device.

15. The camera or optical module according to claim 14, wherein the second optical devices comprise image sensors, each capable of capturing a sub-image, the camera further comprising a camera electronics, wherein the camera electronics is capable of calculating a single image from the plurality of sub-images or comprises an interface to a computing device capable of calculating a single image from the plurality of sub-images.

16. The camera or optical module according to claim 14, wherein to each first optical device an aperture is assigned, whereby light traversing the aperture from an object side is directed via the first optical device to the assigned second device.

17. The camera or optical module according to claim 14, further comprising a third optical device or a plurality of third optical devices, each third optical device comprising an image sensor.

18. The camera or optical module according to claim 14, further comprising a plurality of third optical devices, each third optical device comprising an image sensor, wherein each third optical device is assigned to a first optical device and to a second optical device, each image sensor capable of capturing a sub-image, the camera further comprising a camera electronics, wherein the camera electronics is capable of calculating a single image from the plurality of sub-images or comprises an interface to a computing device capable of calculating a single image from the plurality of sub-images.

19. The camera or optical module according to claim 14, wherein the interior space is hermetically sealed from an outside.

20. The camera or optical module according to claim 14, wherein the screen comprises at least one screening wall ranging from an image-side surface of the first substrate to an object-side surface of the second substrate.

21. The camera or optical module according to claim 14, wherein each first optical device comprises a lens.

22. The cameral or optical module according to claim 21, wherein each second optical device comprise a lens or an image sensor.

23. The camera or optical module according to claim 14, wherein the screen engages positioning features of the spacer and/or of at least one of the first and second substrates.

24. The camera or optical module according to claim 23, wherein the positioning features comprise grooves in a sidewall of the through hole of the spacer.

* * * * *